United States Patent
Chen et al.

(10) Patent No.: US 7,057,277 B2
(45) Date of Patent: Jun. 6, 2006

(54) CHIP PACKAGE STRUCTURE

(75) Inventors: Kai-Chi Chen, Nantou County (TW);
Shu-Chen Huang, Keelung (TW);
Hsun-Tien Li, Hsinchu (TW);
Tzong-Ming Lee, Hsinchu (TW); **Taro
Fukui, Osaka (JP); Tomoaki Nemoto**,
Osaka (JP)

(73) Assignees: **Industrial Technology Research
Institute, Hsinchu (TW); Matsushita
Electric Works, Ltd.**, Osaka (JP)

( * ) Notice: Subject to any disclaimer, the term of this patent is extended or adjusted under 35 U.S.C. 154(b) by 22 days.

(21) Appl. No.: 10/707,686

(22) Filed: Jan. 5, 2004

(65) Prior Publication Data

US 2004/0212056 A1 Oct. 28, 2004

(30) Foreign Application Priority Data

Apr. 22, 2003 (JP) .............................. 2003-117508
Oct. 24, 2003 (TW) .............................. 92129521 A

(51) Int. Cl.
*H01L 23/34* (2006.01)

(52) U.S. Cl. ...................... 257/707; 257/706; 257/720; 257/796

(58) Field of Classification Search ................ 257/707, 257/706, 777–780, 789, 784
See application file for complete search history.

(56) References Cited

U.S. PATENT DOCUMENTS

| | | | |
|---|---|---|---|
| 5,726,079 A * | 3/1998 | Johnson ....................... 438/106 |
| 6,191,360 B1 * | 2/2001 | Tao et al. ................... 174/52.4 |
| 6,265,771 B1 * | 7/2001 | Ference et al. ............. 257/706 |
| 6,288,900 B1 * | 9/2001 | Johnson et al. ............. 361/705 |
| 6,437,240 B1 * | 8/2002 | Smith ......................... 174/52.2 |
| 6,476,502 B1 * | 11/2002 | Yamada et al. ............. 257/778 |
| 6,486,554 B1 * | 11/2002 | Johnson ..................... 257/738 |
| 6,518,666 B1 * | 2/2003 | Ikeda ......................... 257/738 |
| 6,538,321 B1 * | 3/2003 | Huang et al. ............... 257/706 |
| 6,734,552 B1 * | 5/2004 | Combs et al. .............. 257/707 |
| 6,737,750 B1 * | 5/2004 | Hoffman et al. ............ 257/777 |
| 6,777,819 B1 * | 8/2004 | Huang ........................ 257/796 |
| 6,784,541 B1 * | 8/2004 | Eguchi et al. .............. 257/723 |

FOREIGN PATENT DOCUMENTS

JP 02000195994 A * 7/2000

* cited by examiner

*Primary Examiner*—Luan Thai
(74) *Attorney, Agent, or Firm*—Jiang Chyun IP Office

(57) ABSTRACT

A chip package structure is disclosed. The chip package structure essentially comprises a carrier, one or more chips, a heat sink and an encapsulating material layer. At least one of the chips is bonded and electrically connected to the carrier or another chip using a flip-chip bonding technique. A flip-chip bonding gap is set up between the chip and he carrier or other chips. The heat sink is set up over the top chip. The heat sink has an area bigger than the chip. The encapsulating material layer fills up the flip-chip bonding gap and covers the carrier as well as the heat sink. The encapsulating material layer is formed in a simultaneous molding process and has a thermal conductivity more than 1.2 W/m.K. Furthermore, a plurality of standoff components may be selectively positioned on the heat sink.

22 Claims, 5 Drawing Sheets

|  | Example 1 | Example 2 | Example 3 | Example 4 | Example 5 |
|---|---|---|---|---|---|
| Carrier Warpage *1 | 20μm | 20μm | 20μm | 20μm | 20μm |
| Soldering persistency *2 | ▲ | ▲ | ▲ | ▲ | ▲ |
| Temperature cycle reliability *3 | 2000 cycles | 2000 cycles | 2000 cycles | 2000 cycles | 2000 cycles |
| PCT reliability *4 | >500 hours | >500 hours | >500 hours | >500 hours | >500 hours |
| Heat dissipating capacity *5 | 6 minutes | 9 minutes | 9 minutes | 7 minutes | 30 minutes |

|  | Example 6 | Example 7 | Contrast example 1 | Contrast example 2 | Contrast example 3 |
|---|---|---|---|---|---|
| Carrier Warpage *1 | 20μm | 20μm | 80μm | 40μm | 50μm |
| Soldering persistency *2 | ▲ | ▲ | X | O | ▲ |
| Temperature cycle reliability *3 | 2000 cycles | 2000 cycles | 2000 cycles | 2000 cycles | 2000 cycles |
| PCT reliability *4 | >500 hours | >500 hours | 96 hours | 168 hours | >500 hours |
| Heat dissipating capacity *5 | >60 minutes | 25 minutes | 10 minutes | 30 seconds | 30 seconds |

*1 carrier warpage: computed according to the height above a corner-to-corner diagonal line of the carrier.
*2 solder persistency: ▲: JEDEC level II passed; O: JEDEC level III passed;
   (n = 11) X: JEDEC level III failed
*3 temperature recycle reliability: gaseous surrounding, 65°C/15min ~ 150°C/15min
   (n = 11)
*4 PCT reliability: 121°C/2atms
*5 heat dissipating capacity: passing of a 10mA current through aluminum wires on the surface of the device and measuring the interval needed for the aluminum wires to fuse.

FIG. 11

CHIP PACKAGE STRUCTURE

CROSS REFERENCE TO RELATED APPLICATIONS

This application claims the priority benefit of Japan application serial no. 2003-117508, filed Apr. 22, 2003 and Taiwan application serial no. 92129521, filed Oct. 24, 2003.

BACKGROUND OF INVENTION

1. Field of the Invention

The present invention relates to a chip package structure. More particularly, the present invention relates to a chip package structure with superior heat dissipating capacity.

2. Description of the Related Art

In this fast and ever-changing society, information matters to all people. Many types of portable electronic devices are produced which attempts to catch up with our desires to transmit and receive more data. Nowadays, manufacturers have to factor into their chip package many design concepts such as digital architecture, network organization, local area connection and personalized electronic devices. To do so demands special consideration in every aspects of the design process that affects the processing speed, multi-functional capability, integration level, weight and cost of the chip package. In other words, chip packages must be miniaturized and densified. Flip chip (F/C) bonding technique, through the bonding of bumps to a carrier, is currently one of the principle means of reducing overall wiring length over the conventional wire-bonding method. With a shortening of wiring length in a F/C package, signal transmission rate between the chip and a carrier is increased. Thus, F/C packaging technique is one of the most popular methods of forming high-density packages. However, as density of each package continues to increase, heat dissipation becomes a major problem facing chip manufacturers.

FIG. 1 is a schematic cross-sectional view of a conventional chip package with a wire bonding structure. As shown in FIG. 1, the chip packages has a chip 20 with an active surface 22 having a plurality of bonding pads (not shown) thereon. The back of the chip 20 is attached to a carrier 30 so that the active surface 22 faces upwards. The carrier 30 also has a plurality of contact pads (not shown) thereon. A plurality of conductive wires 24 is deployed to connect the various bonding pads with corresponding contact pads so that the chip 20 and the carrier 30 are electrically connected together. Furthermore, an array of solder balls 32 is attached to the carrier 30 on the far side of the chip 20. In other words, the chip package structure 10 has a ball grid array (BGA) packaging structure for connecting electrically with a printed circuit board (PCB) (not shown). In addition, a encapsulating material layer 34 is formed over the carrier 30 to cover the chip 20 and the conductive wires 24. Since the encapsulating material layer 34 is fabricated with material having poor thermal conductivity, the chip package structure 10 has a low heat dissipating capacity.

FIG. 2 is a schematic cross-sectional view of a chip package structure fabricated through a conventional flip-chip packaging technique. As shown in FIG. 2, the chip package structure 40 mainly comprises a chip 50, a carrier 80 and an encapsulating material layer 70. The chip 50 has an active surface 52 with a plurality of bonding pads (not shown) thereon. The carrier 80 also has a plurality of contact pads (not shown) thereon. A plurality of bumps 60 is positioned on the respective bonding pads on the active surface 52 of the chip 50. Furthermore, the bonding pads on the chip 50 and the contact pads on the carrier 80 are electrically connected together through the bumps 60. On the far side of the carrier 80 away from the chip 50, an array of solder balls 90 is attached.

To prevent any damage to the chip 50 due to an incursion of moisture and any damage to the bumps 60 due to mechanical stress, an encapsulating material layer 70 is formed within the bonding gap between the chip 50 and the carrier 80. Conventionally, the encapsulating material layer 70 is formed by channeling a liquid encapsulating material with low viscosity into the bonding gap between the chip 50 and the carrier 80 through capillary effect and then curing the injected material afterwards.

The flip-chip package structure 40 as shown in FIG. 2 has an electrical performance better than the conventional wire-bonded chip package structure 10 in FIG. 1. Furthermore, the flip-chip package structure 40 has an ultra-thin thickness suitable for embedding inside a slim device. However, it takes considerable time to fill up the bonding gap between the chip 50 and the carrier 80 with liquid encapsulating material through capillary effect alone. Hence, this method is unsuitable for economic mass production. Moreover, the number of bumps 60 within the bonding gap, the distribution of the bumps 60 within the package as well as the distance of separation between the flip chip 50 and the carrier 80 are some of the major factors affecting the capillary flow of liquid encapsulating material. Because the capillary effect is utilized to draw liquid encapsulating material into the space between the chip 50 and the carrier 80, any variation of the liquid flow conditions is likely to hinder the filling process leading to the possible formation of voids. In other words, reliability of the package will be adversely affected.

In addition, the chip 50 within the chip package structure 40 is directly exposed. Hence, the chip 50 could be damaged when markings are imprinted on the surface of the chip 50 or the chip package structure 40 is picked up using a suction pad gripping the back of the chip 50. To avoid these defects, an alternative chip package structure is provided. FIGS. 3A and 3B are cross-sectional views of alternative chip package structures fabricated through another conventional flip-chip packaging technique. As shown in FIG. 3A, an additional over mold layer 72 is formed over the chip package structure 40 in FIG. 2 to protect the chip 50 against possible damage.

However, the need to form an additional over mold layer 72 increases the overall processing time resulting a drop in productivity. Moreover, delamination is a likely occurrence at the interface between the encapsulating material layer 70 and the over mold layer 72. In other words, overall reliability of the chip package structure 42 will drop.

To avoid delamination and increase productivity, an improved chip package structure 44 disclosed in Japanese pattern J392698 is shown in FIG. 3B. As shown in FIG. 3B, a simultaneous molding operation is carried out to form an encapsulating material layer 74 that covers the chip 50 and the carrier 80 and fills the bonding gap between the chip 50 and the carrier 80. Although the simultaneous molding process is able to prevent delamination, the encapsulating material layer 74 covering the chip still leads to poor heat dissipation from the chip package structure 44.

SUMMARY OF INVENTION

Accordingly, one objective of the present invention is to provide a chip package structure that combines the superior electrical performance of a flip-chip bonded device with the high heat dissipating capacity of a package with a heat sink.

To achieve these and other advantages and in accordance with the purpose of the invention, as embodied and broadly described herein, the invention provides a chip package structure. The chip package structure mainly comprises a carrier, at least a chip, a heat sink and an encapsulating material layer. The chip has an active surface with a plurality of bumps thereon. The active surface of the chip is flipped over and bonded to the carrier in a flip-chip bonding process so that the chip and the carrier are electrically connected. The heat sink is set up over the chip. The heat sink has an area larger than the chip. The encapsulating material layer completely fills the bonding gap between the chip and the carrier and covers the heat sink and the carrier. Furthermore, the encapsulating material layer is formed in a simultaneous molding process.

The chip package structure according to this embodiment further comprises a plurality of standoff components and a thermal conductive adhesive layer. The standoff components are positioned over the heat sink with a height identical to the thickness of the encapsulating material layer above the heat sink. The thermal conductive adhesive layer is set up between the chip and the heat sink.

This invention also provides an alternative chip package structure. The chip package structure mainly comprises a carrier, a chipset, a heat sink and an encapsulating material layer. The chipset is set over and electrically connected to the carrier. The chipset comprises a plurality of chips and at least one of the chips is flip-chip bonded to the carrier or another chip so that a flip-chip bonding gap is created. The heat sink is set over the chipset. The heat sink has an area larger than the chipset. The encapsulating material layer completely fills the bonding gap between the chip and the carrier and encapsulates the heat sink and the carrier. Furthermore, the encapsulating material layer is formed in a simultaneous molding process.

The chip package structure according to this embodiment further comprises a plurality of standoff components and a thermal conductive adhesive layer. The standoff components are positioned over the heat sink with a height identical to the thickness of the encapsulating material layer above the heat sink. The thermal conductive adhesive layer is set between the uppermost chip of the chipset and the heat sink.

In addition, the chipset of this embodiment comprises a first chip and a second chip. The first chip has a first active surface. The first chip is attached to the carrier such that the first active surface is away from the carrier. The second chip has a second active surface with a plurality of bumps thereon. The second chip is bonded and electrically connected to the first chip in a flip-chip bonding process. The bumps set a flip-chip bonding gap between the first and the second chip.

Furthermore, the chipset further comprises a plurality of conductive wires. Each conductive wire connects a bonding pad on the first chip electrically with a corresponding contact pad on the carrier.

Alternatively, the chipset of this embodiment comprises a first chip, a second chip and a third chip. The first chip has a first active surface with a plurality of first bumps thereon. The first chip is bonded and electrically connected to the carrier in a flip-chip bonding process. The second chip has a second active surface. The second chip is attached to the first chip such that the second active surface is away from the first chip. The third chip has a third active surface with a plurality of second bumps thereon. The third chip is bonded and electrically connected to the second chip in a flip-chip bonding process. The first bumps set up a flip-chip bonding gap between the first chip and the carrier and the second bumps set up a flip-chip bonding gap between the second chip and the third chip.

Furthermore, the chipset further comprises a plurality of conductive wires. Each conductive wire connects a bonding pad on the second chip electrically with a corresponding contact pad on the carrier.

In the aforementioned embodiments of the chip package structure, the encapsulating material layer has a thermal conductivity greater than 1.2 W/m.K. The encapsulating material is a type of resin and the heat sink is made from a metal, for example. The chip package structure may further comprise an array of solder balls and at least a passive component. The solder balls are attached to the surface of the carrier away from the chips. The passive components are set up over and electrically connected to the carrier. The carrier can be a packaging substrate or a lead frame.

In brief, because a heat sink with an area larger than the chip is attached to the uppermost chip, the chip package has a fast heat-dissipating pathway. Hence, reliability of the chip package in computation is improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 11 is a list showing examples, contrast examples as well as various test results performed on the chip package structure fabricated according to the preferred embodiment of this invention.

DETAILED DESCRIPTION

Figure 1:
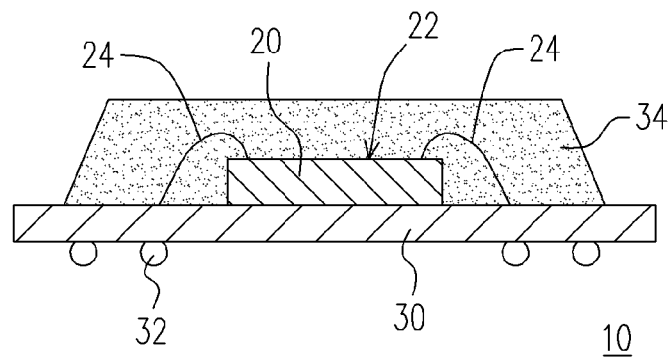
FIG. 1 is a schematic cross-sectional view of a conventional chip package with a wire bonding structure.

Reference will now be made in detail to the present preferred embodiments of the invention, examples of which are illustrated in the accompanying drawings. Wherever possible, the same reference numbers are used in the drawings and the description to refer to the same or like parts.

Figure 4:
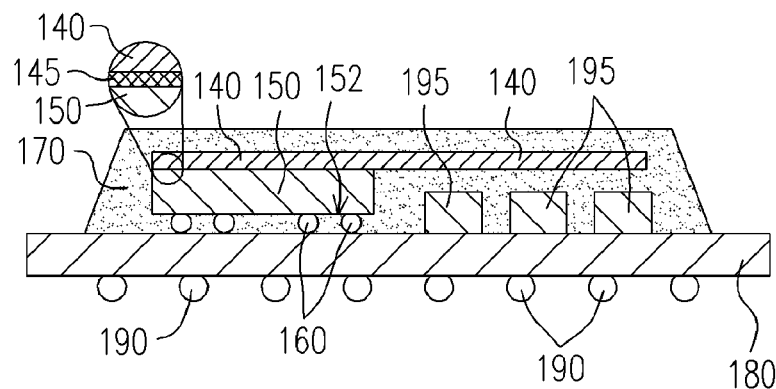
FIG. 4 is a schematic cross-sectional view of a chip package structure according to a first preferred embodiment of this invention.

FIG. 4 is a schematic cross-sectional view of a chip package structure according to a first preferred embodiment of this invention. As shown in FIG. 4, the chip package structure 100 mainly comprises a carrier 180, at least a chip 150, a heat sink 140 and an encapsulating material layer 170. The carrier 180 is, for example, an organic substrate, a ceramic substrate, a flexible substrate or a lead frame used in a flip-chip quad flat non-leaded (F/C QFN) packaging process. The carrier 180 has an upper and a lower surface with a plurality of contact pads (not shown) thereon.

The chip 150 has an active surface 152 with a plurality of bonding pads (not shown) thereon. A plurality of bumps 160 is attached to the bonding pads on the active surface 152 of the chip 150. The active surface 152 of the chip 150 is flipped over to face the carrier 180. Thereafter, the chip 150 is bonded to the carrier 180 through the bumps 160 on the bonding pads so that the chip 150 and the carrier 180 are electrically connected. In other words, the chip package structure 100 of this embodiment includes at least a chip 150 bonded to the upper surface of a carrier 180 using a flip-chip bonding technique. However, aside from the chip 150, this invention also permits the mounting of other chips or passive components such as resistors or capacitors on the carrier 180 within the package structure 100.

The heat sink 140 is set over the chip 150. The heat sink 140 has an area larger than the chip 150 so that a higher heat dissipating capacity is provided. Furthermore, the heat sink 140 is not limited to a single integrative unit. The heat sink 140 may comprise a multiple of individual heat sinks providing more flexibility to the design of the chip package.

Furthermore, the encapsulating material layer 170 completely fills the bonding gap between the chip 150 and the carrier 180 and covers the heat sink 140 as well as the carrier 180. The encapsulating material layer 170 is formed in a simultaneous molding process. The encapsulating material is a type of resin, for example. To ensure a high heat-dissipating rate, the encapsulating material preferably has a thermal conductivity preferably greater than 1.2 W/m.K. Moreover, the encapsulating material layer 170 above the heat sink 140 must have a thickness smaller than 0.3 mm, preferably below 0.1 mm.

The heat sink 140 is fabricated using a metallic material, for example. In this invention, the heat sink 140 has an area larger than the chip 150 so that the heat generated by the chip 150 is able to spread out into a large area. Therefore, metallic materials with high thermal conductivity including, for example, copper plate, aluminum plate, iron plate, nickel plate or other gold plate thereon is preferred. In addition, the heat sink 140 must withstand the pressure encountered during a molding process. Hence, the heat sink 140 is preferably fabricated using a high strength anti-warping material. Although there is a variety of high thermal conductive metallic material to choose from, the heat sink preferably has a thickness greater than 0.1 mm. Moreover, to ensure a strong adhesion between the encapsulating material layer 170 and the heat sink 140, the heat sink 140 may undergo a chemical treatment, a roughening process or a gold plating operation prior to the molding process.

To ensure the formation of a suitable bond between the heat sink 140 and the chip 150, a thermal conductive adhesive layer 145 is applied to the junction between the heat sink 140 and the chip 150 (as shown in an enlarged portion of FIG. 4). Typically, the thermal conductive adhesive layer 145 is a layer of silicone, silver epoxy, soldering paste or other highly thermal conductive materials, for example.

The chip package structure 100 may further comprise an array of solder balls 190 and at least a passive component 195. The solder balls 190 are attached to the contact pads on the lower surface of the carrier 180 for subsequently connecting with a printed circuit board, for example. The passive component 195 set on the upper surface of the carrier 180 and electrically connected with the carrier 180 as well.

Figure 3A:
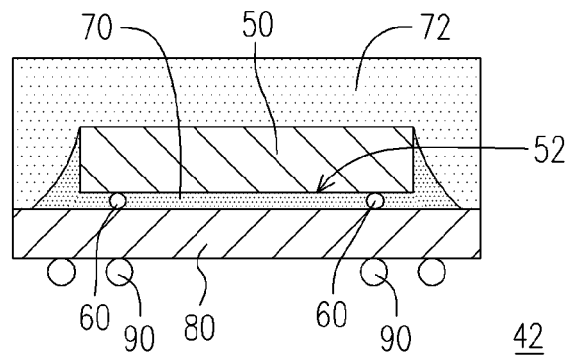
FIGS. 3A and 3B are cross-sectional views of alternative chip package structures fabricated through another conventional flip-chip packaging technique.

It is to be note that the chip package structure 100 according to this invention differs from the conventional chip package structure in FIG. 3A in one major aspect, namely, the encapsulating material layer is formed in a simultaneous molding process. This prevents junction delamination resulting from performing multiple molding processes.

Figure 5:
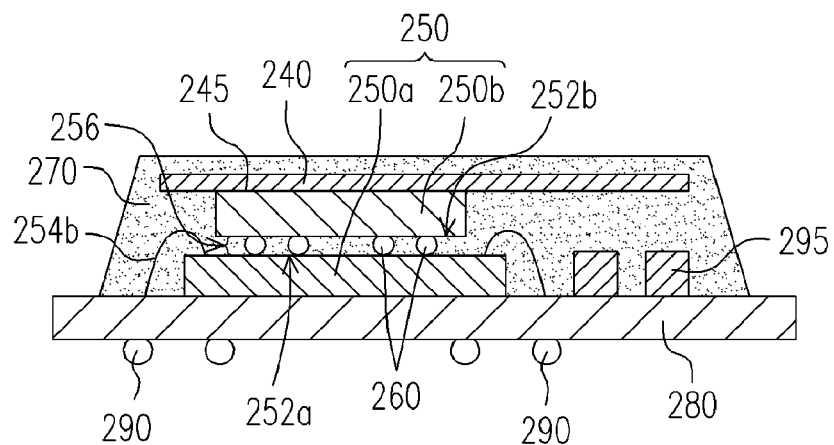
FIGS. 5 and 6 are schematic cross-sectional views of a chip package structure according to a second preferred embodiment of this invention.
Figure 6:
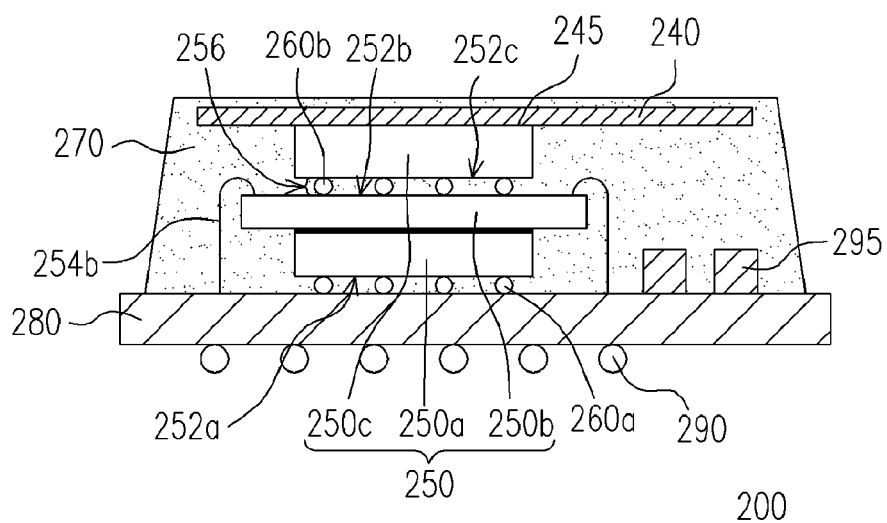

FIGS. 5 and 6 are schematic cross-sectional views of a chip package structure according to a second preferred embodiment of this invention. According to the second embodiment of this invention, a plurality of chips is embedded within the chip package structure. As shown in FIGS. 5 and 6, the chip package structure 200 mainly comprises a carrier 280, a chipset 250, a heat sink 240 and an encapsulating material layer 270. The chipset 250 comprises a plurality of chips and at least one of the chips is flip-chip bonded to the carrier 280 or another chip so that a flip-chip bonding gap 256 is created through the bumps. The heat sink 240 is set over the chipset 250. The encapsulating material layer 270 completely fills the flip-chip bonding gap 256 and covers the heat sink 240 and the carrier 280.

The encapsulating material layer 270 preferably has a thermal conductivity preferably greater than 1.2 W/m.K. To ensure the formation of a suitable bond between the heat sink 240 and the chipset 250, a thermal conductive adhesive layer 245 is applied to the junction between the heat sink 240 and the uppermost chip of the chipset 250. Typically, the thermal conductive adhesive layer 245 is a layer of silicon, silver epoxy, soldering paste or other highly thermal conductive materials, for example.

As shown in FIG. 5, the chipset 250 comprises a first chip 250a and a second chip 250b. The first chip 250a has a first active surface 252a. The first chip 250a is attached to the carrier 280 such that the first active surface 252a is away from the carrier 280. The second chip 250b has a second active surface 252b with a plurality of bumps 260 thereon. The second chip 250b is bonded and electrically connected to the first chip 250a in a flip-chip bonding process. The bumps 260 set up a flip-chip bonding gap 256 between the first chip 250a and the second chip 250b.

Furthermore, the chipset 250 further comprises a plurality of conductive wires 254b. The carrier 280 has a plurality of contact pads (not shown) thereon. The first active surface 252a of the first chip 250a and the second active surface 252b of the second chip 250b have a plurality of bonding pads (not shown) thereon. The bumps 260 on the second chip 250b set up the flip-chip bonding gap 256 between the first chip 250a and the second chip 250b. In other words, the second chip 250b is flip-chip bonded to the first active surface 252a of the first chip 250a. Each conductive wire 254b connects a bonding pad on the first chip 250a electrically with a corresponding contact pad on the carrier 280.

As shown in FIG. 6, an alternative chipset 250 of this embodiment comprises a first chip 250a, a second chip 250b and a third chip 250c. The chipset 250 further includes a plurality of conductive wires 254b. The first chip 250a has a first active surface 252a with a plurality of first bumps 260a thereon. The first chip 250a is bonded and electrically connected to the carrier 280 in a flip-chip bonding process. The second chip 250b has a second active surface 252b. The second chip 250a is attached to the first chip 250a such that the second active surface 252b faces a direction away from the first chip 250a. The conductive wires 254b connect the bonding pads on the second active surface 252b of the second chip 250b with corresponding contact pads on the carrier 280. The third chip 250c has a third active surface 252c with a plurality of second bumps 260b thereon. The third chip 250c is bonded and electrically connected to the second chip 250b in a flip-chip bonding process. The first bumps 260a set up a flip-chip bonding gap between the first chip 250a and the carrier 280 and the second bumps set up a flip-chip bonding gap between the second chip 250b and the third chip 250c. In other words, the third chip 250c is flip-chip bonded to the second active surface 252b of the second chip 250b and the first chip 250a is flip-chip bonded to the carrier 280.

In the second embodiment, the number of chips within the chip package is increased. In addition, not all the chips have to be bonded to the carrier using the flip-chip bonding technique. In fact, the main characteristic of this invention is that the chip packages has at least a chip bonded to a carrier or another chip using the flip-chip bonding technique. Furthermore, a heat sink is mounted on the top of the chip and an encapsulating material layer is formed over the heat sink and the carrier as well as inside the flip-chip bonding gap. Moreover, the encapsulating material layer is formed in a simultaneous molding process. Any chip package structure with the aforementioned characteristics should be accounted as a design within the scope of this invention.

Figure 7A:
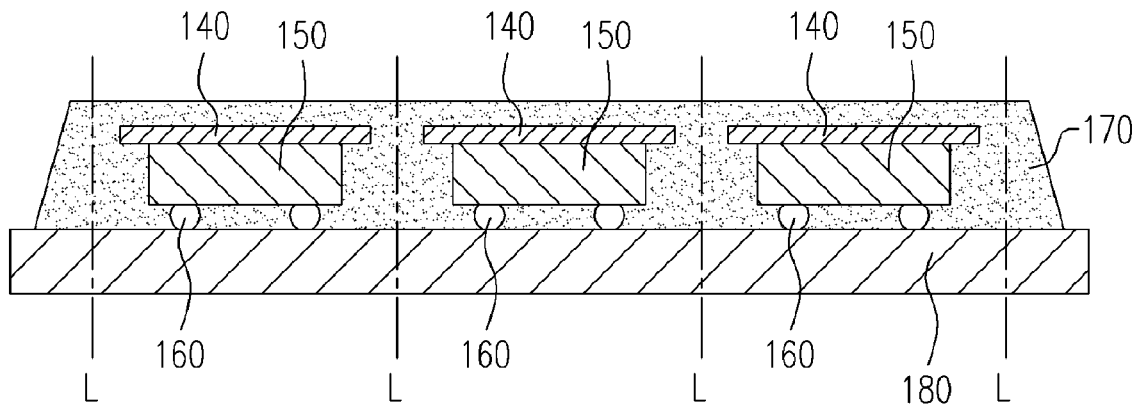
FIG. 7A is a schematic cross-sectional view of a finished product fabricated according to a chip package fabrication process according to this invention.
Figure 7B:
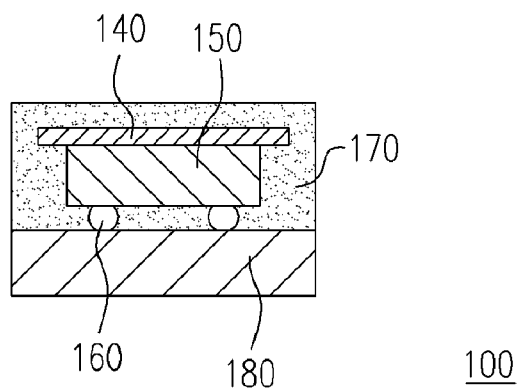
FIG. 7B is a schematic cross-sectional view of a singulated product fabricated according to a chip package fabrication process according to this invention.

FIG. 7A is a schematic cross-sectional view of a finished product fabricated according to a chip package fabrication process according to this invention. FIG. 7B is a schematic cross-sectional view of a singulated product fabricated according to a chip package fabrication process according to this invention. As shown in FIGS. 7A and 7B, the encapsulated semi-finished product is diced along a series of cutting lines L to form a plurality of chip package structures 100. Each singulated chip package 100 at least comprises a chip 150. Although the encapsulating material layer 170 in FIG. 7A is shown to be a coherent mass, the mold for forming the encapsulating material layer 170 can be adjusted to form a plurality of independent encapsulating material layers 170. In other words, encapsulating material is prevented from entering the cutting zones so that total time for cutting out all the chip packages 100 is reduced.

Figure 8:
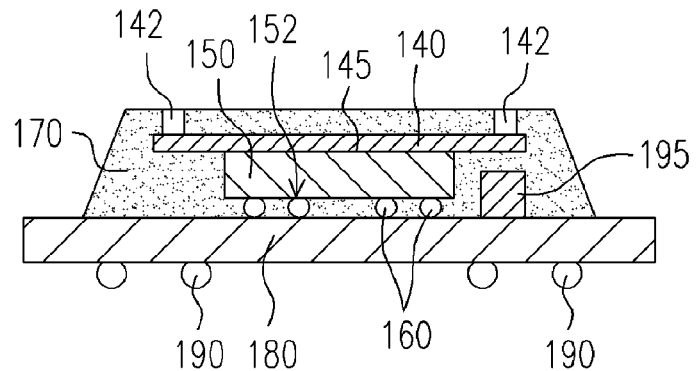
FIG. 8 is a schematic cross-sectional view of a chip package with standoff components according to the embodiment of this invention.

The chip package structure in the aforementioned embodiments may also incorporate a few standoff components within the encapsulating material layer. FIG. 8 is a schematic cross-sectional view of a chip package with standoff components according to the embodiment of this invention. As shown in FIG. 8, the chip package structure 102 has a plurality of additional standoff components 142 compared with the chip package 100 in FIG. 4. The stand-off components are set over the heat sink 140. The stand-off components has a height equal to the thickness of the encapsulating material layer 170 over the heat sink 140, for example. In other words, the ends of the standoff components 142 are exposed.

The standoff components 142 prevents the heat sink 140 from bending when subjected to a molding pressure. Therefore, a thinner and lighter heat sink 140 can be used. Although thickness of the heat sink 140 varies according to the type of material selected, a thickness of more than 0.05 mm is the norm because any smaller dimension may cause a bending or cringing of the heat sink 140 due to self-weight.

One major purpose of setting up standoff components 142 is to stabilize the thickness of the encapsulating material layer 170 over the heat sink 140. In general, there is no special restriction on the size, area, material and production method of the standoff components 142. However, if the standoff component is too large, for example, larger than the device surface, the pressure during the molding process may have some adverse effect on the chip package structure 102 thereby affecting the ultimate reliability of the device. The standoff components 142 can be stationed in several locations above the heat sink 140 using adhesive resin or through a few boring, cutting or trimming processes. In general, there are no special restrictions on the processing methods.

Figure 9A:
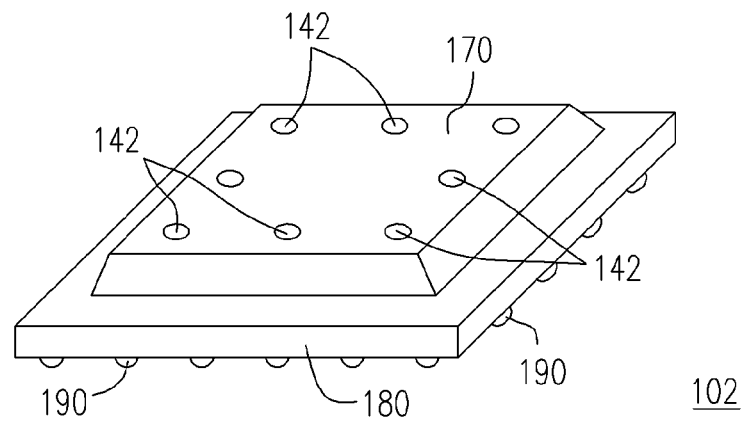
FIGS. 9A and 9B are perspective views of the chip package structure as shown in FIG. 8.
Figure 9B:
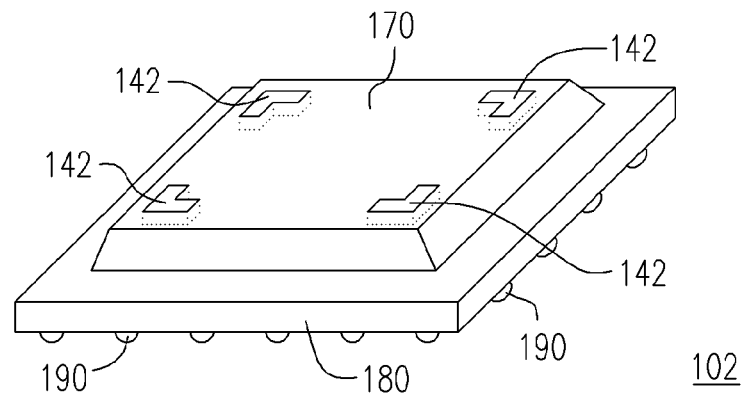

FIGS. 9A and 9B are perspective views of the chip package structure as shown in FIG. 8. As shown in FIG. 9A, the standoff components 142 have a spherical shape. The standoff components 142 are positioned in eight locations around the peripheral area of the chip package structure 102. In FIG. 9B, the standoff components 142 have an angle block shape positioned at four corner around the peripheral area of the chip package structure 102. In general, as long as the standoff components 142 is able to maintain a definite thickness for the encapsulating material layer 170 over the chip package structure 102 without causing any deformation to the heat sink 140, shape and location of the standoff components 142 are unimportant.

In addition, the standoff components 142 is not limited to the chip package structure 100 as shown in FIG. 4. The same design can be applied to the chip package structure 200 as shown in FIGS. 5 and 6 or other chip package structures having the characteristics of this invention.

It is to be noted that a reduced-pressure transfer molding process may be used to form the encapsulating material layer in the process of fabricating the chip package. In the reduced-pressure transfer molding process, the chips to be enclosed are placed inside a mold cavity. After reducing the pressure within the mold cavity, encapsulant is channeled into the mold cavity. Thereafter, the mold is heated and pressurized so that the resin is cured. Ordinary transfer molding process has insufficient capacity for forming a fully filled encapsulating material layer in the flip-chip bonding gap or the over mold layer. On the other hand, if the pressure inside the mold cavity is allowed to lower to a level below 20 mm-Hg, the filling capability of the encapsulating material will improve considerably. Preferably, the mold cavity is set to a pressure below 10 mm-Hg.

Figure 10:
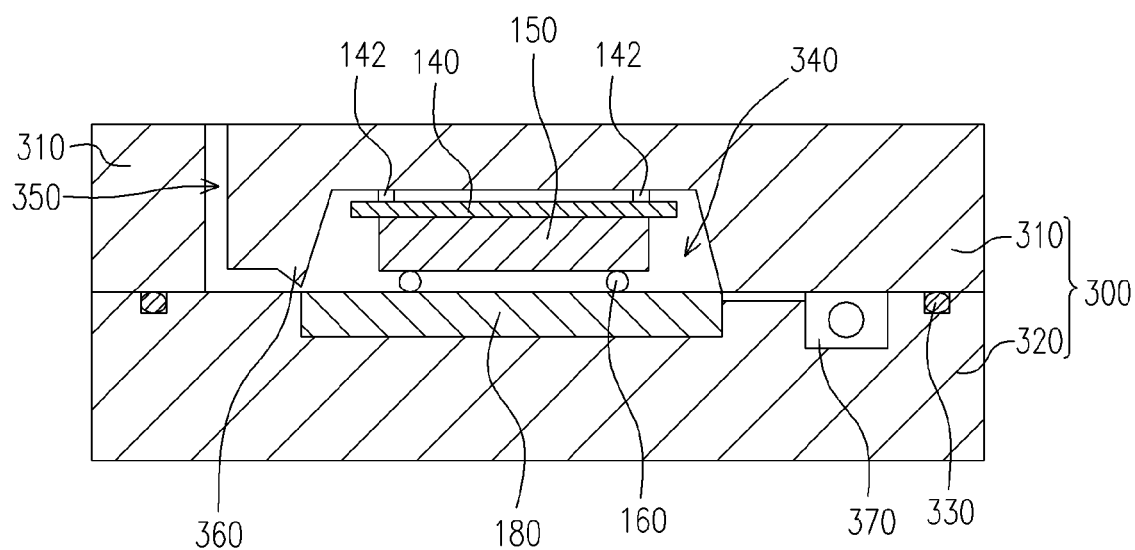
FIG. 10 is a schematic cross-sectional view showing a mold for forming the encapsulating material layer of a chip package in a reduced-pressure transfer molding process according to this invention.

FIG. 10 is a schematic cross-sectional view showing a mold for forming the encapsulating material layer of a chip package in a reduced-pressure transfer molding process according to this invention. As shown in FIG. 10, a mold 300 is placed within a set of transfer molding equipment (not shown). The mold 300 comprises an upper mold section 310 and a lower mold section 320. To provide an effective vacuum when the upper mold 310 and the lower mold 320 are put together, the upper mold section 310, the lower mold section 320 and a vacuum rubber ring 330 inside the mold 300 are pressed to make a light contact. Air is drawn from a mold cavity 340 of the mold 300 using a vacuum pump (not shown) by way of a vacuum pipeline 370 so that the pressure within the mold cavity 340 is reduced. Thereafter, plastic tablets (not shown) are deposited into a plastic injection pipeline 350 within the mold 300. Pumping continues for another 1~5 seconds to increase the degree of vacuum inside the mold cavity 340. In the meantime, the mold 300 is heated so that the plastic tablets melt to form a fluidic encapsulating material. Finally, the upper mold section 310 and the lower mold section 320 are tightly sealed and a plunger 360 is lifted so that the molten encapsulating material is channeled into the mold cavity 340. This completes a reduced-pressure transfer molding process.

During the reduced-pressure molding process, the temperature of the mold is controlled at a temperature at least 5° C. below the melting point of the bumps 160. If temperature of the mold is higher than this value, the pressure generated by the melting encapsulating material may peel from the chip 150 when the bonding strength between the bumps 160 and the chip 150 is not strong enough.

In addition, according to the chip packaging process of this invention, maximum diameter of particles constituting the encapsulating material is preferably smaller than 0.5 times the flip-chip bonding gap. If the encapsulating material contains particles with diameter greater than 0.5 times the flip-chip bonding gap, difficulties in filling the flip-chip gap or forming the over mold layer above the heat sink may be encountered. Furthermore, friction caused by the movement of encapsulating material may damage the chip surface and lower its reliability. Aside from silicon dioxide in the melting state, thermal conductive fillers may be added to the encapsulating material to boost heat-dissipating capacity. Thermal conductive fillers having a high thermal conductivity includes, for example, crystalline silicon, aluminum oxide, silicon nitride, boron nitride and aluminum nitride. Because most high heat conductive encapsulating material has great hardness that easily scratches chip surfaces, maximum particle diameter of the added thermal conductive fillers is preferably below 1/5 times the flip-chip bonding gap.

Another molding process for forming the chip package structure according to the embodiment of this invention is a two-stage process. First, liquid encapsulating material is injected into a mold cavity at a reduced pressure and normal temperature. Thereafter, pressure inside the mold cavity is increased and heat is simultaneously applied to cure the encapsulating material. In this case, spot injection equipment can be used to form the encapsulating material layer. However, because a printing process has a higher output, a commercial "vacuum printing machine" may be used.

In the molding process, liquid encapsulating material is preferably channeled into the mold cavity at a pressure below 2 mm-Hg. If a pressure higher than 2 mm-Hg is used, incomplete filling by the encapsulating material may occur. To cure the encapsulating material, the pressure inside the mold cavity is maintained to a value between 2~5 kg/cm² accompanied by the application of heat whose amount is dependent upon the curing conditions. In the chip package process of this invention, the encapsulating material is preferably heated to a temperature above 40° C. but below the curing temperature for 3 minutes before increasing the pressure for the subsequent curing process. In this way, the viscosity of the encapsulating material will remain low enough to fill all gaps inside the mold cavity.

The maximum particle diameter of filler within the encapsulating material during the liquid state is at most 1/3 times the flip-chip bonding gap and has a percentage weight smaller than 95%. If the particle diameter is greater than 1/3 times the flip-chip bonding gap and has a percentage weight greater than 95%, the filler material may block the flow of encapsulating material leading to an incomplete filling of the flip-chip bonding gap. Aside from silicon dioxide in the melting state, thermal conductive fillers added to the encapsulating material to boost heat-dissipating capacity may include, for example, crystalline silicon, aluminum oxide, silicon nitride, boron nitride and aluminum nitride.

Furthermore, to reduce residual stress within the chip package structure and prevent the carrier from warping, some plasticiser may be added to the encapsulating material in the liquid state. Preferably, the percentage weight of the plasticiser is over 90% and the maximum particle diameter of the plasticiser is at most 1/3 times the flip-chip bonding gap.

In the following, actual examples and contrast examples of this invention as well as their application results are described.

EXAMPLE 1

Chips each having a total area 8 mm×8 mm, 800 lead-tin bumps (melting point 183° C., pitch separation 0.25 mm) and a thickness 0.3 mm are set as an array over a FR-5 carrier with an area 35 mm×35 mm, a thickness 0.4 mm. To provide a uniform distribution of current, aluminum wires are set on the surface of the chip. The flip-chip bonding gap is between 50 to 75 μm. A 20 mm×20 mm heat sink with a thickness of about 0.15 mm is fabricated from a copper plate. The heat sink is attached to the carrier using a conventional thermal conductive adhesive material. To increase the bonding strength, the upper and lower surface of the copper heat sink is roughened. A set of transfer molding equipment with reduced-pressure molding capability is used for performing the reduced-pressure molding process. The pressure inside the mold cavity is reduced to an almost vacuum state of 1 mm-Hg during the molding process. The encapsulating material is comprised of CV8700F2 (having a maximum particle diameter 20 μm, average particle diameter 5 μm, all molten silicone plastic filler, thermal conductivity 0.9 W/m.K) produced by Matsushita Electric Works, Ltd. The encapsulating material layer has a thickness of about 0.65 μm and a total encapsulating area around 29 mm×29 mm. The molding process is carried out at 160° C. and a pressure of 70 kg/cm² for about 2 minutes. Thereafter, a post-curing process is carried out at a temperature of 175° C. for 4 hours to produce a chip package structure as shown in FIG. 4. The thickness of the encapsulating material layer above the heat sink in a section through the device is between 0.12~0.15 mm.

EXAMPLE 2

Aside from changing the package thickness in example 1 to 0.6 mm, other aspects are the same so that a device as shown in FIG. 4 is formed. The thickness of the encapsulating material layer above the heat sink in a section through the device is between 0.08~0.11 mm.

EXAMPLE 3

Aside from using a 0.2 mm aluminum plate to replace the 0.15 mm copper plate in example 1, other aspects are the same so that a device as shown in FIG. 4 is formed. The thickness of the encapsulating material layer above the heat sink in a section through the device is between 0.06~0.10 mm.

EXAMPLE 4

Standoff components with a height of about 0.15 mm is set on a copper plate with a thickness of about 0.1 mm as shown in FIG. 8 and adhesive glue is applied to four corners instead of the outer surface of the 0.15 mm thick copper plate in example 2. Other aspects are the same so that a device as shown in FIG. 4 is formed. The thickness of the encapsulating material layer above the heat sink in a section through the device is between 0.15~0.16 mm.

EXAMPLE 5

Aside from replacing the encapsulating material in example 1 with 50% silicon and 50% aluminum oxide (the maximum particle diameter of the filler material 5 μm, average particle diameter 1.5 μm), other aspects are the same so that a device as shown in FIG. 4 is formed. The encapsulating material has a thermal conductivity 1.5 W/m.K.

EXAMPLE 6

Aside from replacing the encapsulating material in example 2 with 50% silicon and 50% boron nitride (the maximum particle diameter of the filler material 7 μm, average particle diameter 2 μm), other aspects are the same so that a device as shown in FIG. 4 is formed. The encapsulating material has a thermal conductivity 1.9 W/m.K.

EXAMPLE 7

Aside from replacing the encapsulating material in example 4 with 50% silicon and 50% aluminum oxide (the maximum particle diameter of the filler material 5 μm, average particle diameter 1.5 μm), other aspects are the same so that a device as shown in FIG. 4 is formed. The encapsulating material has a thermal conductivity 1.5 W/m.K.

CONTRAST EXAMPLE 1

The same chip as in example 1 and conventional liquid underfill material (Matsushita Electric Works product CV5183F) is used. Spot injection equipment is deployed to carry out the flip-chip bonding gap filling process. After curing the filling material at prescribed conditions, a chip package structure as shown in FIG. 2 is produced.

CONTRAST EXAMPLE 2

Figure 2:
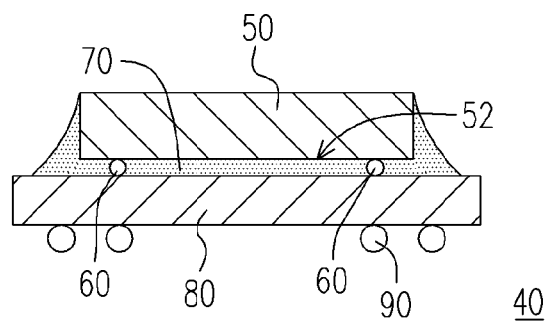
FIG. 2 is a schematic cross-sectional view of a chip package structure fabricated through a conventional flip-chip packaging technique.
Figure 3B:
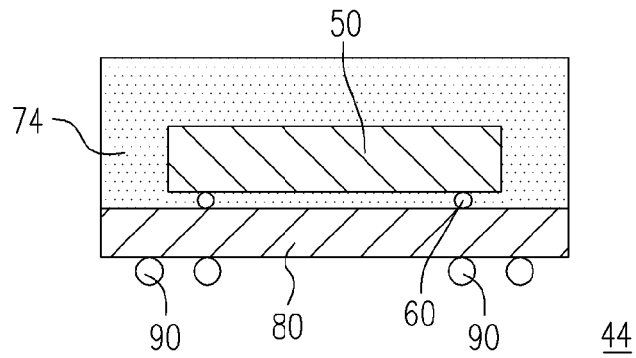

Based on contrast example 1, that is the chip package structure in FIG. 2, the mold and encapsulating material identical to example 2 is used to produce a chip package structure as shown in FIG. 3.

CONTRAST EXAMPLE 3

Aside from not using any heat sink, all other aspects are identical to example 2 so that a chip package structure similar to FIG. 4 is produced.

In the aforementioned examples and contrast examples, the test results of various chip package structures are listed in FIG. 11.

The process of fabricating a chip package according to the preferred embodiment of this invention is based on a technique disclosed in a Japanese pattern JP392698 (2001). This invention aims at optimizing the package dimension as well as incorporating a heat sink so that the chip package can have optimal reliability and heat-dissipating capacity.

In summary, this invention incorporates a heat sink into the chip package structure. Furthermore, the chip is encapsulated in a simultaneous molding process. Hence, the chip package has a lower degree of warping, a higher level of reliability and heat-dissipating capacity than a conventional chip package structure. If an encapsulating material with a high thermal conductivity is deployed, a much higher heat-dissipating capacity can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip package structure, comprising:
    a carrier;
    a chip, having an active surface with a plurality of bumps thereon, wherein the chip is bonded and electrically connected to the carrier in a flip-chip banding process;
    a heat sink, set over the chip, wherein the heat sink has a surface area greater than the chip and is unconnected to the carrier;
    a plurality of standoff components, disposed over the heat sink and in a peripheral area of the chip package structure, wherein the standoff components have a spherical shape; and
    an encapsulating material layer, filling a bonding gap between the chip and the carrier and covering the heat sink and the carrier, wherein a top surface of the encapsulating material layer is higher than that of the heat sink and the encapsulating material layer is formed in a simultaneous molding process.

2. The chip package structure of claim 1, wherein a height of the standoff components above the heat sink is equal to a thickness of the encapsulating material layer over the heat sink.

3. The chip package structure of claim 1, wherein the package further comprises a thermal conductive adhesive layer set between the chip and the heat sink.

4. The chip package structure of claim 1, wherein the encapsulating material layer has a thermal conductivity greater than 1.2 W/m.K.

5. The chip package structure of claim 1, wherein the encapsulating material comprises resin.

6. The chip package structure of claim 1, wherein the heat sink is fabricated using a metallic material.

7. The chip package structure of claim 1, wherein the package further comprises an array of solder balls attached to a carrier surface away from the chip.

8. The chip package structure of claim 1, wherein the package further comprises a passive component set on and electrically connected to the carrier.

9. The chip package structure of claim 1, wherein the carrier is selected from a group consisting of a packaging substrate or a lead frame.

10. A chip package structure, comprising:
    a carrier;
    a chipset, set over and electrically connected to the carrier, wherein the chipset comprises a plurality of chips, at least one of the chips is bonded to the carrier or another chip in a flip-chip bonding process so that a flip-chip bonding gap is created;

a heat sink, set over the chipset, wherein the heat sink has a surface area greater than the chipset and is unconnected to the carrier;

a plurality of standoff components, disposed over the heat sink and in a peripheral area of the chin package structure, wherein the standoff components have a spherical shape; and an encapsulating material layer, filling the flip-chip bonding gap and covering the heat sink and the carrier, wherein a top surface of the encapsulating material layer is higher than that of the heat sink and the encapsulating material layer is formed in a simultaneous molding process.

11. The chip package structure of claim 10, wherein a height of the standoff components above the heat sink is equal to a thickness of the encapsulating material layer over the heat sink.

12. The chip package structure of claim 10, wherein the package further comprises a thermal conductive adhesive layer set between the top surface of the chipset and the heat sink.

13. The chip package structure of claim 10, wherein the encapsulating material layer has a thermal conductivity greater than 1.2 W/m.K.

14. The chip package structure of claim 10, wherein the chipset at least comprises:
a first chip, having a first active surface, wherein the first chip is attached to the carrier such that the first active surface is positioned away from the carrier; and
a second chip, having a second active surface with a plurality of bumps thereon, wherein the second active surface of the second chip is bonded and electrically connected to the first chip in a flip-chip bonding process such that the bumps between the second chip and the first chip set up a flip-chip bonding gap.

15. The chip package structure of claim 14, wherein the chipset further comprises a plurality of conductive wires with ends connected electrically to the first chip and the carrier respectively.

16. The chip package structure of claim 10, wherein the chipset at least comprises:
a first chip, having an active surface with a plurality of first bumps thereon, wherein the first active surface of the first chip is bonded and electrically connected to the carrier in a flip-chip bonding process such that the first bumps between the first chip and the carrier set up a flip-chip bonding gap;
a second chip, having a second active surface, wherein the second chip is attached to the first chip such that the second active surface is positioned away from the first chip; and
a third chip, having a third active surface with a plurality of second bumps thereon, wherein the third active surface of the third chip is bonded and electrically connected to the second chip in a flip-chip bonding process such that the second bumps between the third chip and the second chip set up another flip-chip bonding gap.

17. The chip package structure of claim 16, wherein the chipset further comprises a plurality of conductive wires with ends electrically connected to the second chip and the carrier respectively.

18. The chip package structure of claim 10, wherein the encapsulating material comprises resin.

19. The chip package structure of claim 10, wherein the heat sink is fabricated using a metallic material.

20. The chip package structure of claim 10, wherein the package further comprises an array of solder balls attached to a carrier surface away from the chipset.

21. The chip package structure of claim 10, wherein the package further comprises a passive component set on and electrically connected to the carrier.

22. The chip package structure of claim 10, wherein the carrier is selected from a group consisting of a packaging substrate or a lead frame.

* * * * *